(12) United States Patent
Risaki

(10) Patent No.: US 9,966,476 B2
(45) Date of Patent: May 8, 2018

(54) SEMICONDUCTOR MEMORY DEVICE HAVING FIRST AND SECOND FLOATING GATES OF DIFFERENT POLARITY

(71) Applicant: SII Semiconductor Corporation, Chiba-shi, Chiba (JP)

(72) Inventor: Tomomitsu Risaki, Chiba (JP)

(73) Assignee: SII Semiconductor Corporation (JP)

( * ) Notice: Subject to any disclaimer, the term of this patent is extended or adjusted under 35 U.S.C. 154(b) by 37 days.

(21) Appl. No.: 15/146,702

(22) Filed: May 4, 2016

(65) Prior Publication Data
US 2016/0329339 A1     Nov. 10, 2016

(30) Foreign Application Priority Data
May 7, 2015   (JP) .................................. 2015-095004

(51) Int. Cl.
| | | |
|---|---|---|
| H01L 27/115 | (2017.01) | |
| H01L 29/788 | (2006.01) | |
| H01L 29/66 | (2006.01) | |
| H01L 21/311 | (2006.01) | |
| H01L 21/28 | (2006.01) | |
| H01L 29/423 | (2006.01) | |
| H01L 29/51 | (2006.01) | |
| H01L 29/49 | (2006.01) | |

(52) U.S. Cl.
CPC .... *H01L 29/7883* (2013.01); *H01L 21/28273* (2013.01); *H01L 29/42324* (2013.01); *H01L 29/4983* (2013.01); *H01L 29/513* (2013.01)

(58) Field of Classification Search
USPC ......................................................... 257/317
See application file for complete search history.

(56) References Cited

U.S. PATENT DOCUMENTS

2009/0140317 A1*   6/2009   Rosmeulen ....... H01L 21/28273
                                                                     257/316

OTHER PUBLICATIONS

Abstract, Publication No. 11-067940, Publication Date Mar. 9, 1999.
Abstract, Publication No. 2004-071077, Publication Date Mar. 4, 2004.

\* cited by examiner

*Primary Examiner* — Joseph C Nicely
*Assistant Examiner* — Thai T Vuong
(74) *Attorney, Agent, or Firm* — Adams & Wilks

(57) ABSTRACT

A semiconductor memory device includes a first floating gate and a second floating gate of conductivity types with different polarities. Injection of electrons into the first floating gate via a tunnel insulating film is stored through a decrease in holes in a valence band of the second floating gate, and ejection of electrons from the first floating gate via the tunnel insulating film is stored through an increase in holes in the valence band of the second floating gate.

4 Claims, 7 Drawing Sheets

(a)

(b)

(c)

(d)

(e)

(a)

(b)

(c)

(d)

(e)

(a)

(b)

(c)

(d)

(a)

(b)

(c)

(d)

US 9,966,476 B2

SEMICONDUCTOR MEMORY DEVICE HAVING FIRST AND SECOND FLOATING GATES OF DIFFERENT POLARITY

BACKGROUND OF THE INVENTION

1. Field of the Invention

The present invention relates to a semiconductor memory device.

2. Description of the Related Art

A related-art semiconductor memory device is described by taking an EEPROM as an example. FIG. 5 is a sectional view for illustrating a concept of a related-art EEPROM that has a general structure as described in Japanese Patent Application Laid-open No. 2004-071077.

A unit cell of the EEPROM includes a memory main body portion 002 and a select gate transistor portion 001 configured to select the memory main body portion 002. In the memory main body portion 002, there is formed an electrode called a floating gate 013 configured to accumulate electric charge. Accumulating electrons in the floating gate 013 puts the memory main body portion 002 into an enhancement mode where a threshold thereof is high, which is regarded as a "1" state, and accumulating holes in the floating gate 013 puts the memory main body portion 002 into a depletion mode where the threshold is low, which is regarded as a "0" state.

Writing of the "1" state involves applying a positive voltage to a select gate 003 and a control gate 015, setting potentials of an n-type select transistor drain region 005, an n-type memory cell source 011, and a p-type semiconductor substrate 006 to GND, and injecting electrons from an n-type tunnel drain region 009 into the floating gate 013 via a tunnel insulating film 010. In the following, writing of the "1" state is described with reference to band diagrams.

FIG. 6A to FIG. 6D are band diagrams taken along the line A-A' of FIG. 5, and are illustrations of changes in state in writing of the "1" state. The p-type semiconductor substrate 006 is omitted. $E_F$, $E_C$, and $E_V$ in FIG. 6A to FIG. 6D are a Fermi level, a lower end of a conduction band, and an upper end of a valence band, respectively. In this case, the floating gate 013 and the control gate 015 are supposed to be formed of n-type polysilicon.

In a memory cell transistor in a state of thermal equilibrium illustrated in FIG. 6A, under a voltage state in the writing of the "1" state described above, specifically, when a potential of the n-type tunnel drain region 009 is set to GND and a potential of the control gate 015 is set positive, the band diagram of FIG. 6B is obtained. As indicated by the arrow in FIG. 6B, electrons 018 are injected from the n-type tunnel drain region 009 into the floating gate 013 via the tunnel insulating film 010 by a Fowler-Nordheim (FN) current mechanism. A potential of the floating gate 013 with the electrons 018 injected thereinto drops (in FIG. 6C, rises) as indicated by the hollow arrow in FIG. 6C. When a potential applied to the tunnel insulating film 010 is weakened and an FN current stops, writing operation of the "1" state is completed.

An EEPROM is a nonvolatile memory that can retain information even after power-off, and thus, is generally required to have the ability to retain the "1" state for tens of years under a state in which the potential of the n-type tunnel drain region 009 and the potential of the control gate 015 are set to GND as illustrated in FIG. 6D. However, as indicated by the hollow arrow in FIG. 6C, the potential of the floating gate 013 drops due to the electrons 018 injected into the floating gate 013, and thus, in a data retention state illustrated in FIG. 6D, an electric field in a direction of leakage of the electrons 018 injected into the floating gate 013 to the n-type tunnel drain region 009 via the tunnel insulating film 010 is applied to the tunnel insulating film 010. In this state, if the tunnel insulating film 010 is thin or deteriorated, unintended electron leakage 020 may occur as illustrated in FIG. 6D, which may result in data retention failure.

Next, the "0" state is considered. The "0" state is written as follows. A positive voltage is applied to the select gate 003 and the n-type select transistor drain region 005, the control gate 015 and the p-type semiconductor substrate 006 are connected to GND, the n-type memory cell transistor source region 011 is set floated, and the electrons 018 are ejected from the floating gate 013 to the n-type tunnel drain region 009 via the tunnel insulating film 010. This is described below with reference to band diagrams.

FIG. 7A to FIG. 7D are band diagrams of writing of the "0" state, taken along the line A-A' of FIG. 5. Similarly to FIG. 6A to FIG. 6D, the p-type semiconductor substrate 006 is omitted, and $E_F$, $E_C$, and $E_V$ are a Fermi level, a lower end of a conduction band, and an upper end of a valence band, respectively. Further, the floating gate 013 and the control gate 015 are supposed to be formed of n-type polysilicon.

In a memory cell transistor in a state of thermal equilibrium illustrated in FIG. 7A, under a voltage state in the writing of the "0" state described above, specifically, when the potential of the control gate 015 is set to GND and the potential of the n-type tunnel drain region 009 is set positive, the band diagram of FIG. 7B is obtained. As indicated by the arrow in FIG. 7B, the electrons 018 are ejected from the floating gate 013 into the n-type tunnel drain region 009 via the tunnel insulating film 010 by the Fowler-Nordheim (FN) current mechanism. A potential of the floating gate 013 with the reduced electrons 018 rises as indicated by the hollow arrow in FIG. 7C. When a potential applied to the tunnel insulating film 010 is weakened and an FN current stops, writing operation of the "0" state is completed.

An EEPROM is a nonvolatile memory that can retain information even after power-off, and thus, is generally required to have the ability to retain the "0" state for tens of years under a state in which the potential of the n-type tunnel drain region 009 and the potential of the control gate 015 are set to GND as illustrated in FIG. 7D. However, as indicated by the hollow arrow in FIG. 7C, the potential of the floating gate 013 rises due to the reduction in electrons 018 in the floating gate 013, and thus, in a data retention state illustrated in FIG. 7D, an electric field in a direction of injection of the electrons 018 into the floating gate 013 from the n-type tunnel drain region 009 via the tunnel insulating film 010 is applied to the tunnel insulating film 010. In this state, if the tunnel insulating film 010 is thin or deteriorated, the unintended electron leakage 020 may occur as illustrated in FIG. 7D, which may result in data retention failure.

As described above, the problem of data retention failure (retention failure) is inherent in a nonvolatile memory. Japanese Patent Application Laid-open No. 11-067940, discloses a method of reducing the retention failure described above. According to the invention, a lowered concentration of impurities in a floating gate in the vicinity of a tunnel insulating film reduces trap sites in the tunnel insulating film, thereby reducing retention failure caused by the trap sites.

However, even if the method disclosed in Japanese Patent Application Laid-open No. 2004-071077 is used, an electric field in a direction of inhibiting retention of electric charge existing in the floating gate 013 is still applied to the tunnel insulating film 010, and a retention failure described with reference to FIG. 6A to FIG. 6D and FIG. 7A to FIG. 7D is not fundamentally improved. Another method of reducing the retention failure is to simply increase a thickness of the tunnel insulating film 010, which does not fundamentally improve the retention failure described with reference to FIG. 6A to FIG. 6D and FIG. 7A to FIG. 7D. Increase in thickness of the tunnel insulating film 010 requires a higher write voltage, and thus, as a result, a problem arises that a chip size increases.

In other words, those improving methods cannot reduce the thickness of the tunnel insulating film 010 while preventing the unintended electron leakage 020 that hinders data retention. It can be said that this prevents the write voltage from being lowered and the chip size from being shrunk to hinder a nonvolatile memory breakthrough.

SUMMARY OF THE INVENTION

In order to solve the problem described above, the following measures are taken.

A semiconductor memory device includes a floating gate formed of a semiconductor, the floating gate includes a first floating gate and a second floating gate, and the first floating gate and the second floating gate are of conductivity types with different polarities.

Further, a semiconductor memory device includes: a memory cell transistor source region formed in a surface layer of a semiconductor substrate; a memory cell transistor drain region formed apart from the memory cell transistor source region;

a tunnel drain region formed between the memory cell transistor source region and the memory cell transistor drain region so that the tunnel drain region is in contact with the memory cell transistor drain region;

a tunnel insulating film formed on part of the tunnel drain region in the semiconductor substrate;

a gate insulating film formed on part of the tunnel drain region, part of the memory cell transistor source region, and part of the semiconductor substrate between the tunnel drain region and the memory cell transistor source region;

a first floating gate formed on the semiconductor substrate via the gate insulating film including the tunnel insulating film;

a second floating gate formed so as to be in contact with the first floating gate; and a control gate formed on the second floating gate via an insulating film.

A leakage current in a data retention state is reduced, and thus, an effect of improving a retention property can be obtained. Further, a thickness of the tunnel insulating film can be reduced, and thus, a data write voltage can be lowered, which leads to shrinkage of a chip size.

BRIEF DESCRIPTION OF THE DRAWINGS

FIG. 2A is a band diagram in a state of thermal equilibrium, FIG. 2B is a band diagram in an early stage of the writing of the "1" state, FIG. 2C is a band diagram at an end of the writing of the "1" state, and FIG. 2D is a band diagram in a state of retaining the "1" state.

FIG. 3A is a band diagram in a state of thermal equilibrium, FIG. 3B is a band diagram in an early stage of the writing of the "0" state, FIG. 3C is a band diagram at an end of the writing of the "0" state, and FIG. 3D is a band diagram in a state of retaining the "0" state.

FIG. 6A is a band diagram in a state of thermal equilibrium, FIG. 6B is a band diagram in an early stage of the writing of the "1" state, FIG. 6C is a band diagram at an end of the writing of the "1" state, and FIG. 6D is a band diagram in a state of retaining the "1" state.

FIG. 7A is a band diagram in a state of thermal equilibrium, FIG. 7B is a band diagram in an early stage of the writing of the "0" state, FIG. 7C is a band diagram at an end of the writing of the "0" state, and FIG. 7D is a band diagram in a state of retaining the "0" state.

DETAILED DESCRIPTION OF THE INVENTION

Embodiments of the present invention are described below with reference to the attached drawings.

Figure 1:
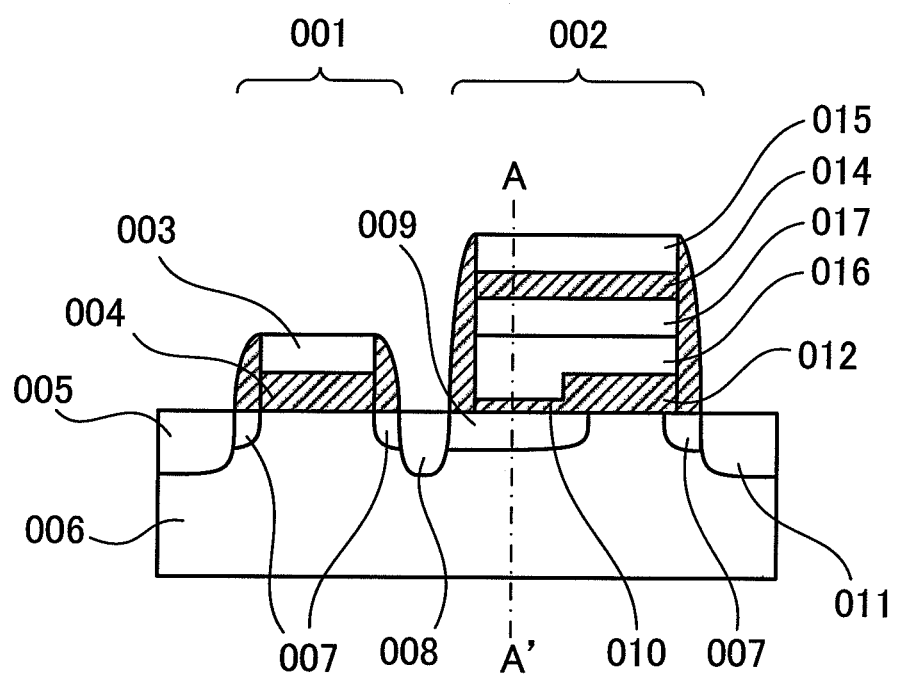
FIG. 1 is a sectional view for illustrating an EEPROM according to the present invention.
Figure 5:
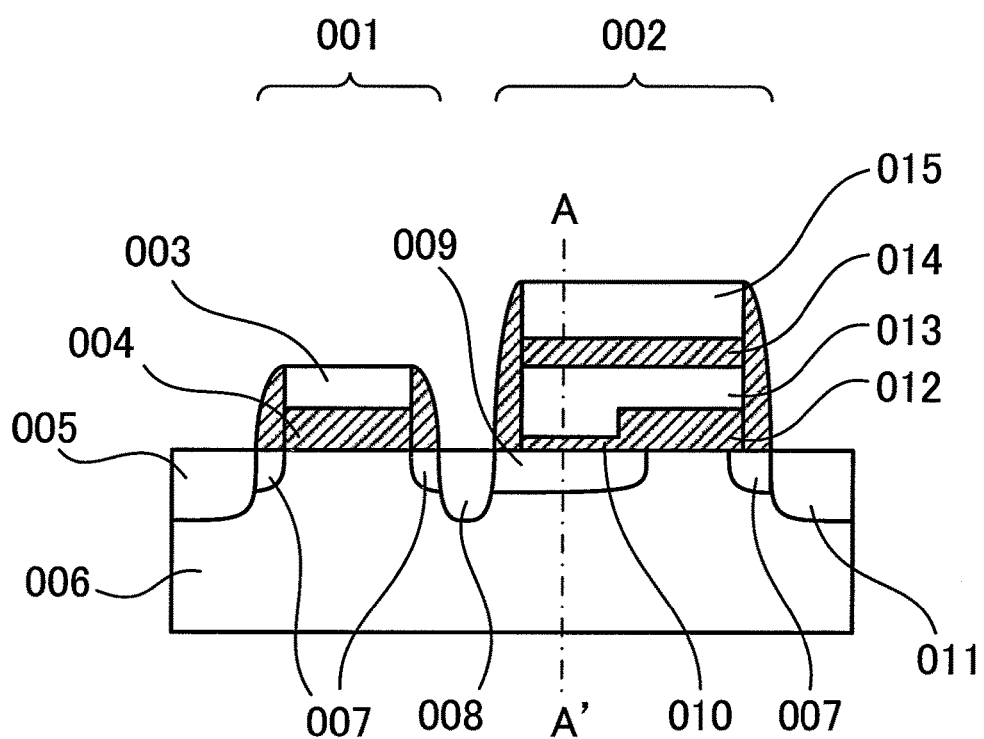
FIG. 5 is a sectional view for illustrating a related-art EEPROM.
Figure 6A:
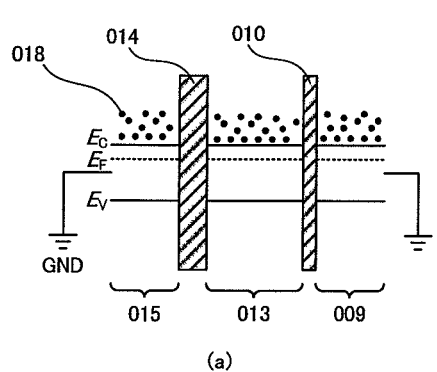
FIG. 6A to FIG. 6D are band diagrams for illustrating the related-art EEPROM, taken along the line A-A' of FIG. 5, and are illustrations of writing of a "1" state.
Figure 6B:
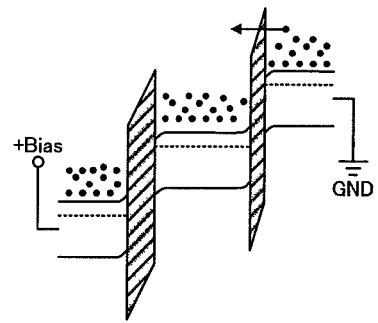
Figure 6C:
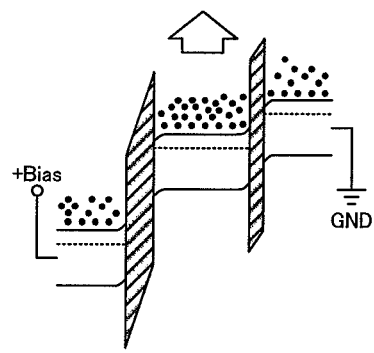
Figure 6D:
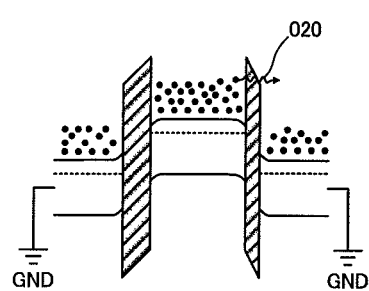
Figure 7A:
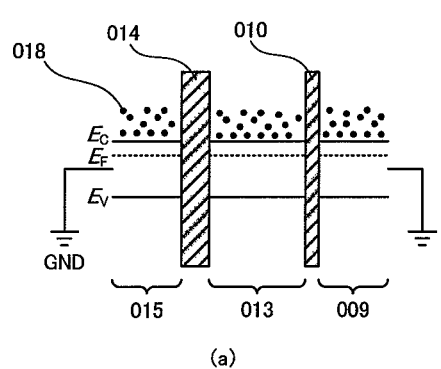
FIG. 7A to FIG. 7D are band diagrams for illustrating the related-art EEPROM, taken along the line A-A' of FIG. 5, and are illustrations of writing of a "0" state.
Figure 7B:
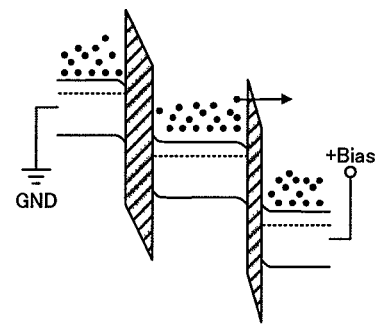
Figure 7C:
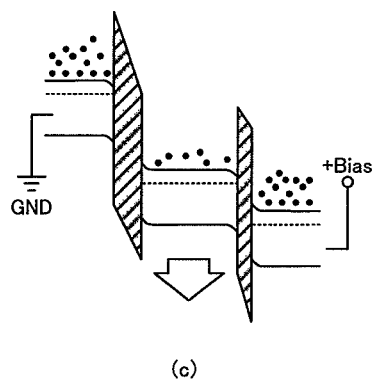
Figure 7D:
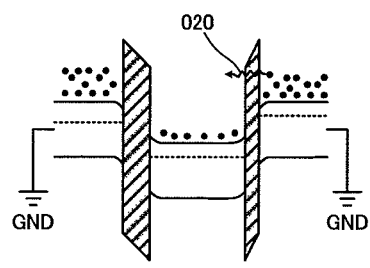

FIG. 1 is a sectional view for illustrating an EEPROM according to the present invention. The EEPROM according to the present invention includes, similarly to the related-art EEPROM illustrated in FIG. 5, a memory main body portion 002 and a select gate transistor portion 001 configured to select the memory main body portion 002. The operation principle of the EEPROM according to the present invention is the same as that of the related-art EEPROM described above. A different point is that a floating gate according to the present invention includes a first floating gate 016 and a second floating gate 017. Those floating gates are supposed to be formed of a semiconductor such as polysilicon, and the first floating gate 016 and the second floating gate 017 are different in polarity of the semiconductor. As a result, in the floating gate, the first floating gate 016 and the second floating gate 017 form a pn junction.

FIG. 2A to FIG. 2E are band diagrams taken along the line A-A' of FIG. 1 in writing of a "1" state when, for example, the first floating gate 016 is formed of an n-type semiconductor and the second floating gate 017 is formed of a p-type semiconductor. The p-type semiconductor substrate 006 is omitted. $E_F$, $E_C$, and $E_V$ in FIG. 2A to FIG. 2E are a Fermi level, a lower end of a conduction band, and an upper end of a valence band, respectively. The floating gate 013 is formed of the first floating gate 016 and the second floating gate 017. The control gate 015 is supposed to be formed of an n-type semiconductor.

Figure 2A:
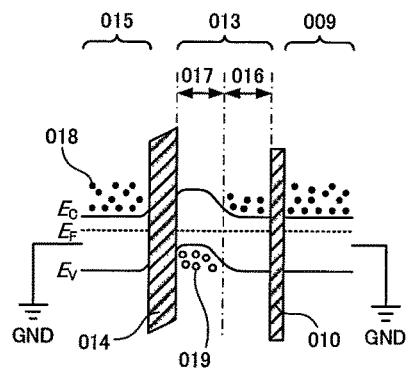
FIG. 2A to FIG. 2E are band diagrams for illustrating the EEPROM according to the present invention, taken along the line A-A' of FIG. 1, and are illustrations of writing of a "1" state.
Figure 2B:
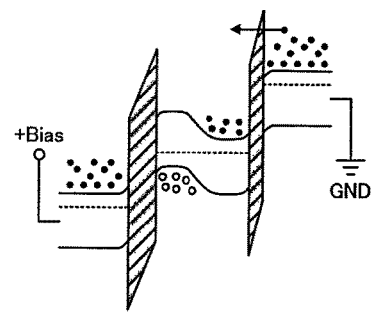

In a memory cell transistor in a state of thermal equilibrium illustrated in FIG. 2A, under a voltage state in the writing of the "1" state described above, specifically, when a potential of an n-type tunnel drain region 009 is set to GND and a potential of the control gate 015 is set to a positive one, the band diagram of FIG. 2B is obtained. As indicated by the arrow in FIG. 2B, electrons 018 are injected from the n-type tunnel drain region 009 into the first floating gate 016 via a tunnel insulating film 010 by an FN current mechanism.

Figure 2C:
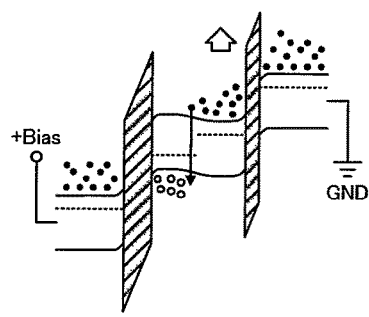
Figure 2D:
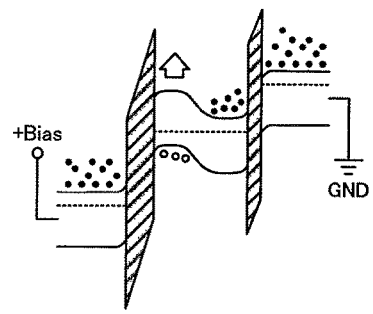

A potential of the first floating gate 016 with the electrons 018 injected thereinto drops (in FIG. 2C, rises) as indicated by the hollow arrow in FIG. 2C. A potential applied to the tunnel insulating film 010 is weakened and an FN current stops, and at the same time, a built-in potential between the first floating gate 016 and the second floating gate 017 is weakened. Then, as illustrated in FIG. 2D, the electrons 018 in the conduction band of the first floating gate 016 flow into the conduction band of the second floating gate 017.

The electrons 018 that flow into the conduction band of the second floating gate 017 drop into the valence band of the second floating gate 017 (recombine with holes). Those electrons 018 drop (in FIG. 2D, raise) a potential of the second floating gate 017 as indicated by the hollow arrow in FIG. 2D, the weakened built-in potential between the first floating gate 016 and the second floating gate 017 returns to its original state, the inflow of the electrons 018 from the conduction band of the first floating gate 016 to the conduction band of the second floating gate 017 stops to achieve a steady state. In this way, the "1" state writing operation is completed. That is, information of the "1" state accumulated in the floating gate 017 is stored through a phenomenon in which holes in the valence band of the second floating gate 017 reduces (phenomenon in which electrons increase).

Figure 2E:
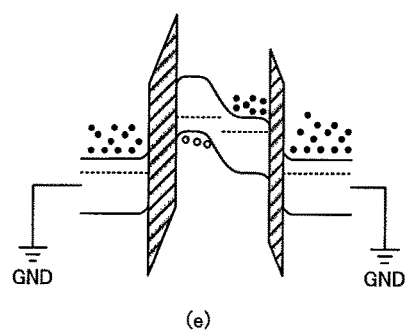

This is considered in the context of a data retention state, that is, a state in which the potential of the n-type tunnel drain region 009 and the potential of the control gate 015 are set to GND as illustrated in FIG. 2E. Similarly to the case of the related art, a potential is applied in a direction of leakage of the electrons 018 from the first floating gate 016 to the n-type tunnel drain region 009 via the tunnel insulating film 010, and thus, there is a possibility that the electrons 018 in the conduction band of the first floating gate 016 escape to the n-type tunnel drain region 009 as unintended electron leakage 020. However, most of the information of the "1" state is stored in the valence band of the second floating gate 017, and thus, even when the tunnel insulating film 010 is thin, the "1" state can be retained and retention failure is prevented.

Figure 3A:
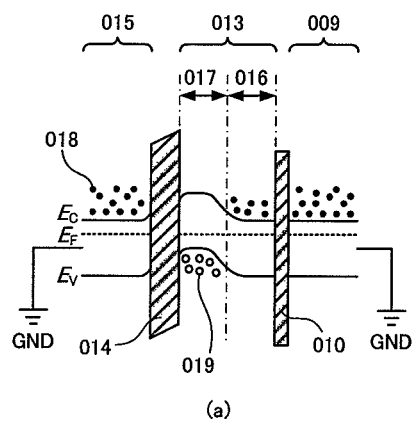
FIG. 3A to FIG. 3E are band diagrams for illustrating the EEPROM according to the present invention, taken along the line A-A' of FIG. 1, and are illustrations of writing of a "0" state.
Figure 3B:
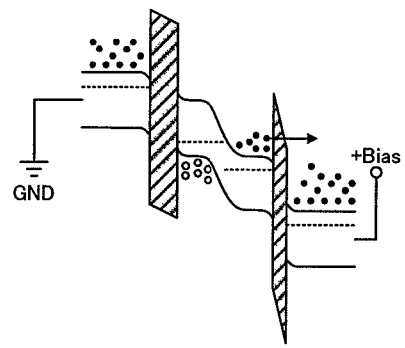

Next, writing of a "0" state is considered. In a memory cell transistor in a state of thermal equilibrium illustrated in FIG. 3A, under a voltage state in the writing of the "0" state, specifically, when the potential of the control gate 015 is set to GND and the potential of the n-type tunnel drain region 009 is set positive, the band diagram of FIG. 3B is obtained. As indicated by the arrow in FIG. 3B, the electrons 018 are ejected from the first floating gate 016 into the n-type tunnel drain region 009 via the tunnel insulating film 010 by the FN current mechanism.

Figure 3C:
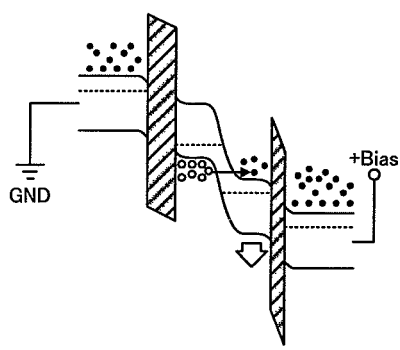

The potential of the first floating gate 016 with the electrons 018 ejected therefrom rises (in FIG. 3C, drops) as indicated by the hollow arrow in FIG. 3C. The potential applied to the tunnel insulating film 010 is weakened and the FN current stops, and at the same time, the built-in potential between the first floating gate 016 and the second floating gate 017 is strengthened. Then, as illustrated in FIG. 3C, the electrons 018 in the valence band of the second floating gate 017 flow into the conduction band of the first floating gate 016 by a Zener mechanism or an avalanche mechanism (the arrow in FIG. 3C indicates the case of the Zener mechanism).

Figure 3D:
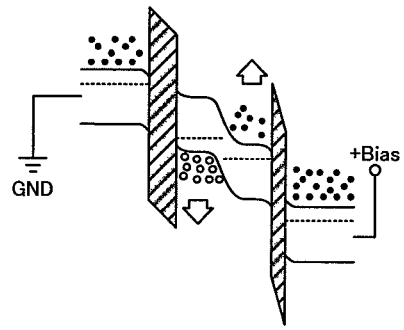

Transfer of the electrons 018 drops a potential of the first floating gate 016 and raises a potential of the second floating gate 017 as indicated by the hollow arrows in FIG. 3D, the built-in potential between the first floating gate 016 and the second floating gate 017 returns to its original state, the inflow of the electrons 018 from the valence band of the second floating gate 017 to the conduction band of the first floating gate 016 by the Zener mechanism or the avalanche mechanism stops to achieve a steady state. In this way, the "0" state writing operation is completed. That is, information of the "0" state accumulated in the floating gate 017 is stored through a phenomenon in which holes in the valence band of the second floating gate 017 are increased.

Figure 3E:
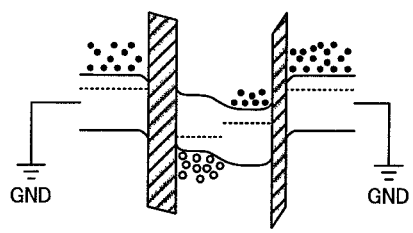

This is considered in the context of a data retention state, that is, a state in which the potential of the n-type tunnel drain region 009 and the potential of the control gate 015 are set to GND as illustrated in FIG. 3E. Similarly to the case of the related art, a potential is applied in a direction of leakage of the electrons 018 from the n-type tunnel drain region 009 to the first floating gate 016 via the tunnel insulating film 010, and thus, there is a possibility that the electrons 018 in the conduction band of the n-type tunnel drain region 009 flow into the first floating gate 016 as the unintended electron leakage 020. However, most of the information of the "0" state is stored in the valence band of the second floating gate 017, and thus, even when the tunnel insulating film 010 is thin, the "0" state can be retained and retention failure is prevented.

As described above, according to the present invention, the information of the memory is stored in the second floating gate 017 that is not in direct contact with the tunnel insulating film 010, and thus, even when a thickness of the tunnel insulating film 010 is reduced to increase the unintended electron leakage 020, the retention failure is less liable to occur. The thickness of the tunnel insulating film 010 can be reduced, accordingly, to lower a write voltage, which enables a chip size to be reduced.

Figure 4:
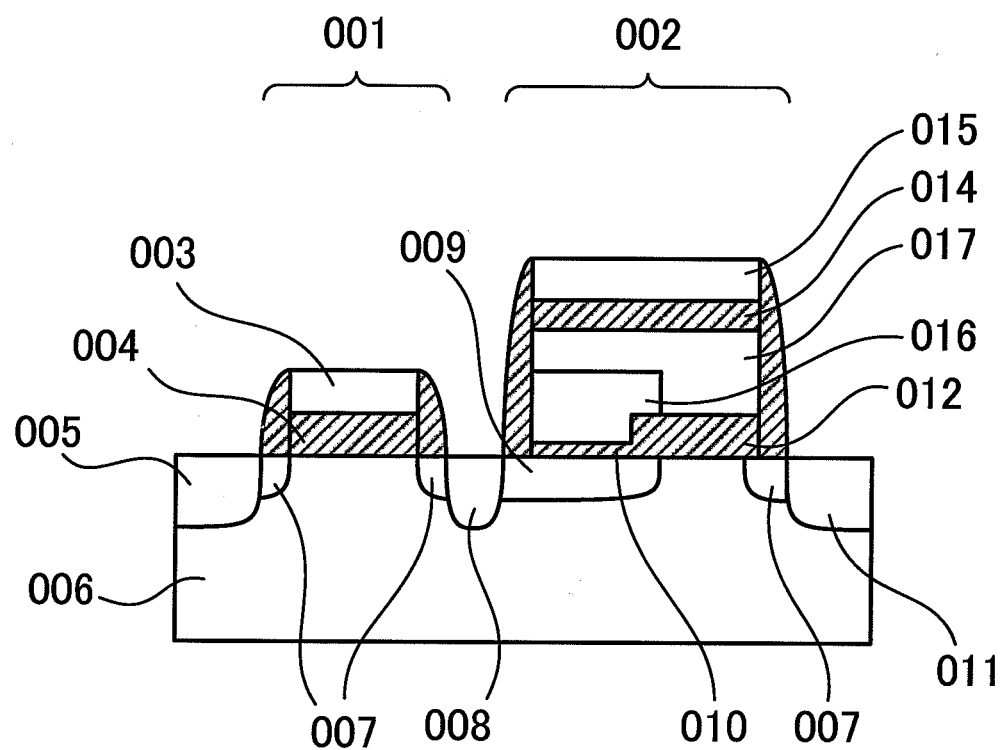
FIG. 4 is a sectional view for illustrating an EEPROM according to the present invention.

Another embodiment is described below. In order to obtain the effect described above, it is only necessary that the first floating gate 016 be the only floating gate in contact with the tunnel insulating film 010, and at the same time, the first floating gate 016 be in contact with the second floating gate 017. Accordingly, as illustrated in FIG. 4, a structure is also possible in which the second floating gate 017 is L-shaped and is in contact with and covers an upper surface and part of a side surface of the first floating gate 016.

Further, in the embodiments described above, the first floating gate 016 is formed of an n-type semiconductor and the second floating gate 017 is formed of a p-type semiconductor, but a similar effect can be obtained when the first floating gate 016 is formed of a p-type semiconductor and the second floating gate 017 is formed of an n-type semiconductor.

Further, in the embodiments described above, the floating state is limited to a case in which there are two layers of a semiconductor of different polarities, that is, a case in which there is one junction in the floating gate, but a similar effect can be obtained when there are three or more layers (two or more junctions).

What is claimed is:
1. A semiconductor memory device, comprising:
   a memory cell transistor source region formed in a surface layer of a semiconductor substrate;
   a memory cell transistor drain region formed apart from the memory cell transistor source region;
   a tunnel drain region formed between the memory cell transistor source region and the memory cell transistor drain region so that the tunnel drain region is in contact with the memory cell transistor drain region;
   a tunnel insulating film formed on part of the tunnel drain region in the semiconductor substrate;

a gate insulating film formed on part of the tunnel drain region, part of the memory cell transistor source region, and part of the semiconductor substrate between the tunnel drain region and the memory cell transistor source region;

a first floating gate formed on the semiconductor substrate via the gate insulating film comprising the tunnel insulating film;

a second floating gate formed so as to be in contact with the first floating gate; and a control gate formed on the second floating gate via an insulating film, wherein injection of electrons into the first floating gate via the tunnel insulating film is stored through decrease in holes in a valence band of the second floating gate, and wherein ejection of electrons from the first floating gate via the tunnel insulating film is stored through increase in holes in the valence band of the second floating gate.

2. A semiconductor memory device according to claim 1, wherein the first floating gate comprises an n-type semiconductor, wherein the second floating gate comprises a p-type semiconductor, and wherein the first floating gate and the second floating gate form a pn junction.

3. A semiconductor memory device according to claim 1, wherein an entire upper surface of the first floating gate is in contact with the second floating gate.

4. A semiconductor memory device according to claim 1, wherein an upper surface and part of a side surface of the first floating gate is in contact with the second floating gate.

* * * * *